(12) United States Patent
Lee

(10) Patent No.: US 7,522,460 B2
(45) Date of Patent: Apr. 21, 2009

(54) APPARATUS FOR CONTROLLING COLUMN SELECTING SIGNAL OF SEMICONDUCTOR MEMORY APPARATUS AND METHOD OF CONTROLLING THE SAME

(75) Inventor: Jeong-Woo Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 234 days.

(21) Appl. No.: 11/589,811

(22) Filed: Oct. 31, 2006

(65) Prior Publication Data

US 2007/0104013 A1    May 10, 2007

(30) Foreign Application Priority Data

Nov. 9, 2005   (KR) .................. 10-2005-0107056

(51) Int. Cl.
*G11C 7/00* (2006.01)

(52) U.S. Cl. ............. 365/194; 365/189.07; 365/189.09; 365/230.06

(58) Field of Classification Search ............ 365/189.07, 365/189.09, 194, 230.05, 230.06
See application file for complete search history.

(56) References Cited

U.S. PATENT DOCUMENTS

| | | | |
|---|---|---|---|
| 5,608,674 A * | 3/1997 | Yabe et al. ............. | 365/189.05 |
| 5,777,945 A | 7/1998 | Sim et al. | |
| 5,982,703 A | 11/1999 | Oh | |
| 6,055,210 A * | 4/2000 | Setogawa ............. | 365/233.12 |
| 6,104,659 A * | 8/2000 | Yagishita et al. ........... | 365/226 |
| 6,208,580 B1 | 3/2001 | Ozeki | |
| 6,335,885 B1 * | 1/2002 | Shimizu ................. | 365/194 |
| 2005/0140969 A1 | 6/2005 | Kang et al. | |

* cited by examiner

*Primary Examiner*—Hoai V Ho
(74) *Attorney, Agent, or Firm*—Venable LLP; Jeffri A. Kaminski

(57) ABSTRACT

An apparatus for controlling a column selecting signal of semiconductor memory apparatus comprising a column decoder that outputs a first column selecting signal, a signal control unit that outputs a second column selecting signal that is generated by controlling an enable period of the first column selecting signal, and an output control unit that outputs the first column selecting signal or the second column selecting signal in response to the input of a predetermined voltage detecting signal.

9 Claims, 5 Drawing Sheets

APPARATUS FOR CONTROLLING COLUMN SELECTING SIGNAL OF SEMICONDUCTOR MEMORY APPARATUS AND METHOD OF CONTROLLING THE SAME

BACKGROUND

1. Technical Field

The present invention relates to a semiconductor memory apparatus, and more particularly, to an apparatus for controlling a column selecting signal of a semiconductor memory apparatus and a method of controlling the same.

2. Related Art

In recent years, the operating frequency of a semiconductor memory apparatus has increased so as to write or read a large amount of data more quickly. In addition, unlike when the semiconductor memory apparatus is used regardless of power consumption in a system, such as a desktop where the memory can generally use commercial power, the semiconductor memory apparatus is now widely used in portable equipment, such as a notebook computer or a PMP (Portable Multimedia Player), where a battery has a predetermined runtime.

Therefore, various power supply voltage levels in the memory are reduced so as to realize low power consumption, and the voltage levels of various control signals are correspondingly reduced.

There are various kinds of control signals that are used in the semiconductor memory apparatus. Among the control signals, a column selecting signal (hereinafter, simply referred to as a "Yi") is a very important signal that designates timings of data read and data write, which are basic memory operations.

According to the related art, as shown in FIG. 1, the Yi is generated by a column decoder 10 and output to a cell array 20 among a plurality of cell arrays that corresponds to the Yi Further, data write operations and data read operations on corresponding cells are performed during an enable period, that is, the pulse width of the Yi, by a corresponding sense amplifier or the like.

However, as described above, the existing semiconductor memory does not generate a Yi when a power voltage level is low, causing data reading and writing errors in the semiconductor memory apparatus. In particular, when the operating frequency increases, the above-described errors in the Yi generation become worse.

SUMMARY

Embodiments of the present invention provide an apparatus and method of controlling a column selecting signal of a semiconductor memory apparatus that is capable of generating a normal column selecting signal regardless of a power supply voltage level.

According to an embodiment of the present invention, an apparatus for controlling a column selecting signal of a semiconductor memory apparatus includes a signal control unit that outputs a second column selecting signal that is generated by controlling an enable period of a first column selecting signal, a voltage detection unit that outputs a detecting signal according to the result of a comparison between an internal voltage and a preset reference voltage, and an output control unit that selectively outputs one of the first column selecting signal or the second column selecting signal according to the detecting signal.

According to another embodiment of the present invention, a method of controlling a column selecting signal of a semiconductor memory apparatus includes generating a first column selecting signal; generating a second column selecting signal generated by controlling an enable period of the first column selecting signal; determining a level of a voltage that is used to generate the first column selecting signal; and outputting to a corresponding cell array, one of the first column selecting signal or the second column selecting signal, according to the determination result.

According to still another embodiment of the present invention, a method of controlling a column selecting signal of a semiconductor memory apparatus, that includes a voltage detection unit and a signal control unit includes generating a first column selecting signal; generating a second column selecting signal generated by controlling an enable period of the first column selecting signal; determining by the voltage detection unit whether an internal voltage level is equal to or greater than a reference voltage level; outputting the first column selecting signal to a corresponding cell array, when it is determined that the internal voltage level is equal to or greater than the reference voltage level; and outputting to the corresponding cell array, the second column selecting signal by the signal control unit, when it is determined that the internal voltage level is less than the reference voltage level.

BRIEF DESCRIPTION OF THE DRAWINGS

The above and other features and advantages of the present invention will become more apparent by describing in detail preferred embodiments thereof with reference to the attached drawings in which.

DESCRIPTION OF EXEMPLARY EMBODIMENTS

Hereinafter, a detailed description of an apparatus and method of controlling a column selecting signal in a semiconductor memory apparatus according to an embodiment of the present invention will be described with reference to the accompanying drawings.

Figure 1:
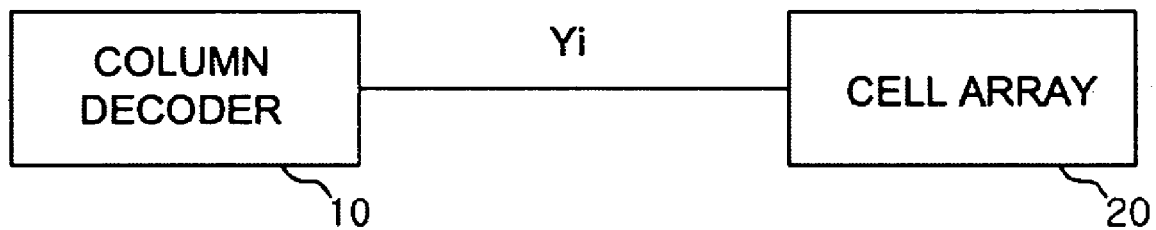
FIG. 1 is a block diagram illustrating the structure of generating a column selecting signal of a semiconductor memory apparatus according to the related art.
Figure 2:
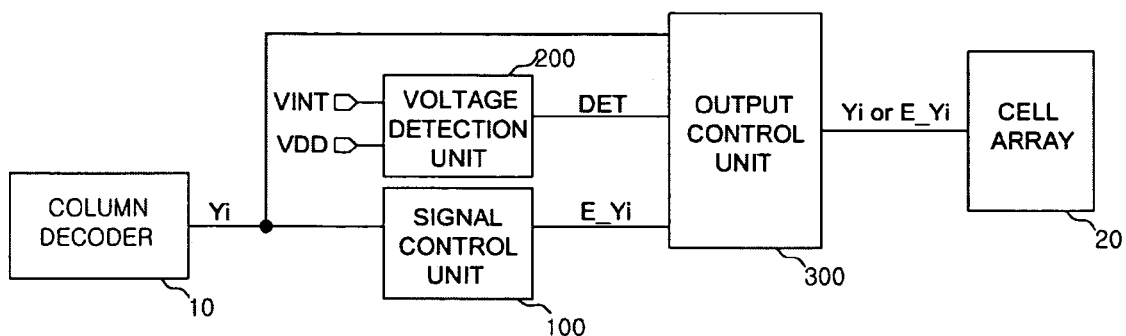
FIG. 2 is a block diagram illustrating the structure of an apparatus for controlling a column selecting signal of a semiconductor memory apparatus according to an embodiment of the present invention.

As shown in FIG. 2, the apparatus for controlling a column selecting signal of a semiconductor memory apparatus according to an embodiment of the present invention includes a signal control unit 100 that outputs a second column selecting signal (hereinafter, "E_Yi"), which is generated by increasing an enable period, that is, a pulse width of a first column selecting signal (hereinafter, "Yi"), which is output from a column decoder 10, a voltage detection unit 200 that detects whether a predetermined voltage VINT (internal voltage) is equal to or greater than a preset reference voltage VREF so as to output a detecting signal DET according to the detection, and an output control unit 300 that selects and outputs one of the YI or the E_Yi that is output from the signal control unit 100 according to the detecting signal DET.

Figure 3:
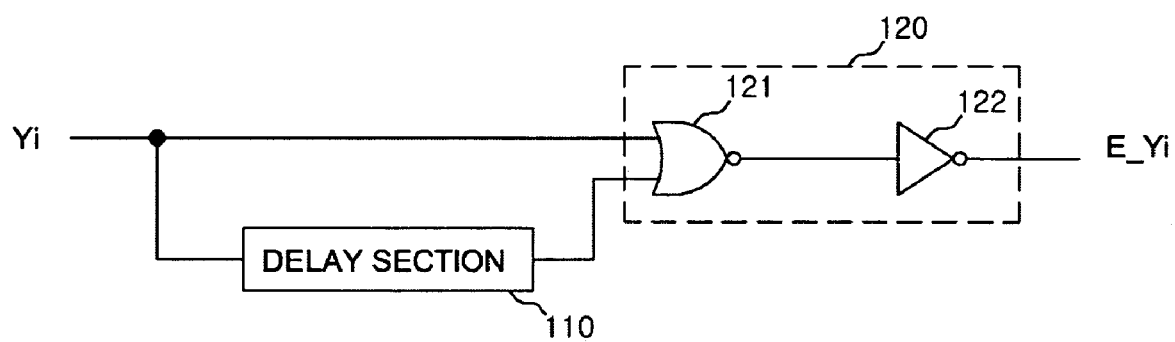
FIG. 3 is a circuit diagram illustrating the internal structure of a signal control unit of FIG. 2.

As shown in FIG. 3, the signal control unit 100 includes a delay section 110 that delays the Yi for a predetermined time and a logic circuit section 120 that performs an operation on the Yi and the Yi that is delayed by the delay section 110. Here, a pulse width increment of the Yi is determined according to a delay time of the delay section 110. Further, the delay section 110 includes a resistor, a capacitor, or a combination of a resistor and a capacitor (not shown). The logic circuit section 120 has a NOR gate 121 so as to perform an OR operation and an inverter 122 that inverts the output of the NOR gate 121.

Figure 4:
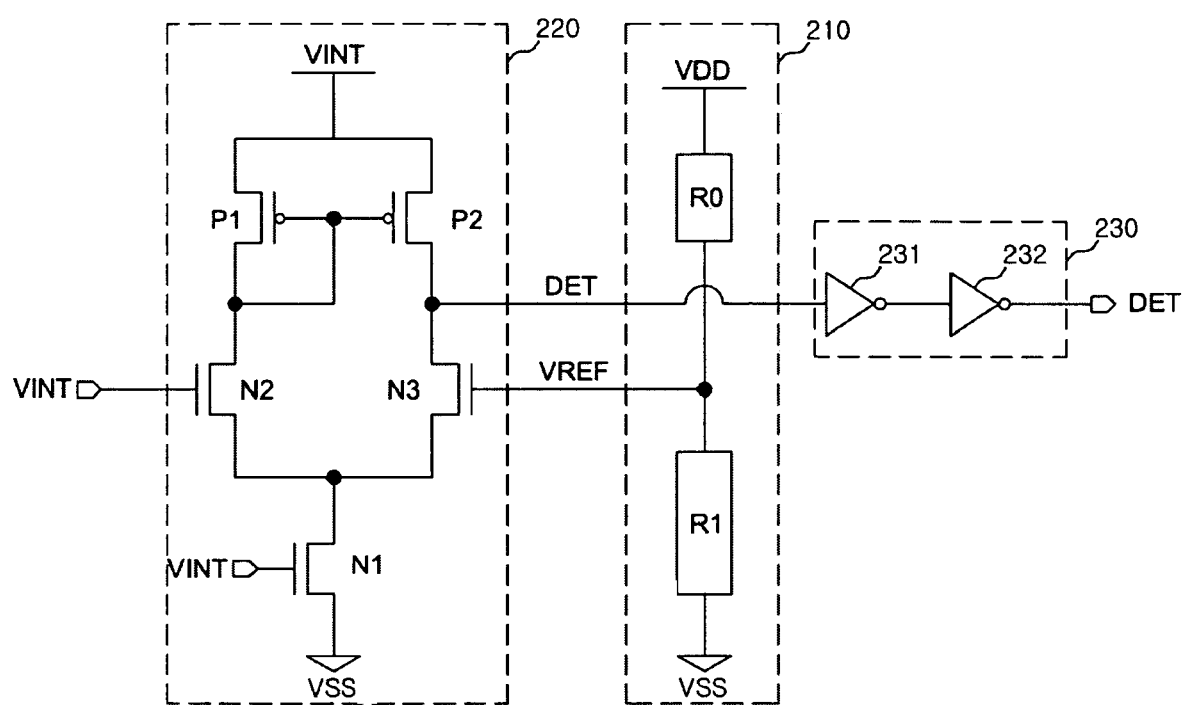
FIG. 4 is a circuit diagram illustrating the internal structure of a voltage detection unit of FIG. 2.

Turning to FIG. 4, the voltage detection unit 200 includes a reference voltage generating section 210 that generates a reference voltage VREF by using an external voltage VDD, a comparing section 220 that compares the reference voltage VREF with a predetermined voltage VINT so as to output a detecting signal DET according to the comparison, and a buffering section 230 that buffers an output of the comparing section 220 at a complete logic level. Here, the reference voltage generating section 210 includes at least two resistors R0 and R1 that are connected between an external power supply terminal VDD and a ground terminal VSS. The comparing section 220 includes a differential amplifier. At this time, the differential amplifier includes a first transistor N1 that is connected to a ground terminal, second and third transistors P1 and N2 that are connected between an internal power supply terminal VINT and the first transistor N1, and fourth and fifth transistors P2 and N3 that are provided between an internal power supply terminal VINT and the first transistor N1 and are connected in parallel with the second and third transistors P1 and N2. At this time, gates of the second transistor P1 and the fourth transistor P2 are connected in common to the drain of the second transistor P1, the gate of the third transistor N2 is connected to the internal power supply terminal VINT, the gate of the fifth transistor N3 is connected to the reference voltage VREF, and the detecting signal DET is output from a connection node of the fourth transistor P2 and the fifth transistor N3.

Figure 5:
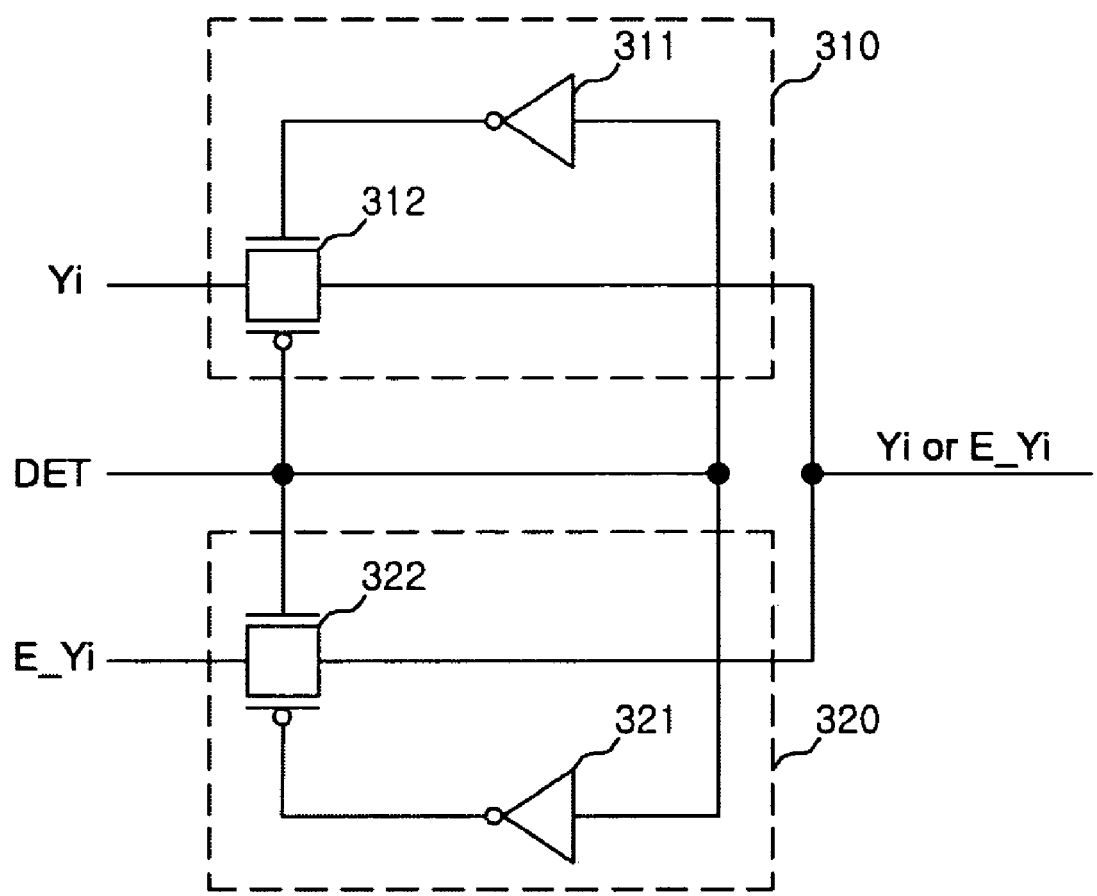
FIG. 5 is a circuit diagram illustrating the internal structure of an output control unit of FIG. 2.

As shown, in FIG. 5, the output control unit 300 includes a first switching section 310 that outputs the Yi according to the detecting signal DET and a second switching section 320 that outputs the E_Yi that has been output from the signal control unit 100 according to the detection signal DET. At this time, the first switching section 310 includes an inverter 311 that inverts the detecting signal DET, and a pass gate 312 that has an input terminal, which receives the Yi, a first control terminal, which receives the detecting signal DET having been inverted by the inverter 311, and a second control terminal, which receives the detecting signal DET. The second switching section 320 includes an inverter 321 that inverts the detecting signal DET, and a pass gate 322 that has an input terminal, which receives the E_Yi, a first control terminal, which receives the detecting signal DET, and a second control terminal, which receives the detecting signal DET having been inverted by the inverter 321

The operation according to the disclosed embodiment of the present invention will be described below.

First, when a Yi is output from the column decoder 10, the signal control unit 100 outputs an E_Yi that is generated by increasing the pulse width of the Yi by a delay time in the delay section 110.

The Yi and the E_Yi are input to the first switching section 310 and the second switching section 320, respectively, of the output control unit 300.

Meanwhile, the reference voltage generating section 210 of the voltage detection unit 200 divides the external voltage VDD by the voltage dividing resistors R0 and R1 so as to generate the reference voltage VREF, and inputs the reference voltage VREF to the comparing section 220.

At this time, the reference voltage VREF is used to determine whether the external voltage VDD is at a level where the Yi can normally be generated, and the reference voltage VREF is in proportion to the variation of the external voltage VDD. The reference voltage VREF is generated by using a voltage used in Yi generation. According to the exemplary embodiment of the present invention, the voltage, which is used in the Yi generation, is the external voltage VDD, for example. However, another voltage may be used depending on various reasons, such as operating environments, design changes, changes in element characteristics, or the like. In this case, a corresponding voltage is used to generate the reference voltage VREF.

Subsequently, the comparing section 220 of the voltage detection unit 200 compares the predetermined voltage VINT with the reference voltage VREF. When the predetermined voltage VINT is greater than the reference voltage VREF, the fourth transistor P2 is turned on, and the detecting signal DET is correspondingly output at a high level.

As the detecting signal DET is output at the high level, the pass gate 312 of the first switching section 310 of the output control unit 300 is turned off, while the pass gate 322 of the second switching section 320 is turned on.

Therefore, the E_Yi is output to the cell array 20 through the pass gate 322 of the second switching section 320. That is, when the reference voltage VREF is generated by the external voltage VDD, the reference voltage VREF is less than the predetermined voltage VINT, which means that the external voltage VDD is at such a low voltage level that it may be impossible to normally generate the Yi. Therefore, the E_Yi that is generated by increasing the pulse width of the Yi is output.

Meanwhile, the comparing section 220 of the voltage detection unit 200 compares the predetermined voltage VINT with the reference voltage VREF. Here, when the reference voltage VREF is greater than the predetermined voltage VINT, the fifth transistor N3 is turned on and the detection signal DET is correspondingly output at a low level. As the detecting signal DET is output at the low level, the pass gate 312 of the first switching section 310 of the output control unit 300 is turned on, while the pass gate 322 of the second switching section 320 is turned off.

Accordingly, the Yi is output to the cell array 20 through the pass gate 312 of the first switching section 310. That is, when the reference voltage VREF is generated by the external voltage VDD, the reference voltage VREF is greater than the predetermined voltage VINT, which means the external voltage VDD is at a level sufficient to normally generate the Yi. Therefore, the Yi is output in its original state.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

The apparatus and method of controlling a column selecting signal of a semiconductor memory apparatus according to the embodiment of present invention can improve the reliability of the memory operation by preventing column selecting signal output errors resulting from the variation in the external voltage, by adjusting column selecting signals according to a level of the external voltage and outputting them.

What is claimed is:

1. An apparatus for controlling a column selecting signal of a semiconductor memory apparatus, comprising:
   a column decoder configured to output a first column selecting signal generated by a first voltage;
   a signal control unit configured to output a second column selecting signal that is generated by increasing enable period of the first column selecting signal;
   a voltage detection unit configured to output a detecting signal according to a result of a comparison between the first voltage and a preset second voltage; and
   an output control unit configured to receive the detecting signal and output the first column selecting signal when the first voltage is higher than the second voltage and output the second column selecting signal when the second voltage is higher than the first voltage.

2. The apparatus of claim 1,
   wherein the signal control unit includes:
   a delay section configured to delay the first column selecting signal for a predetermined delay time; and
   a logic circuit section configured to perform operations on the first column selecting signal and the first column selecting signal that is delayed by the delay section.

3. The apparatus of claim 2,
   wherein an increment of an enable period of the first column selecting signal is determined by the delay time of the delay section.

4. The apparatus of claim 2,
   wherein the delay section includes at least one of a resistor or a capacitor.

5. The apparatus of claim 2,
   wherein the logic circuit section performs an OR operation.

6. The apparatus of claim 2,
   wherein the logic circuit section includes a NOR gate.

7. The apparatus of claim 1,
   wherein the output control unit includes:
   a first switching section configured to output the first column selecting signal according to the detecting signal; and
   a second switching section configured to output the second column selecting signal that is output from the signal control unit according to the detecting signal.

8. The apparatus of claim 7,
   wherein the first switching section includes a pass gate having an input terminal configured to receive the first column selecting signal, and a first control terminal and a second control terminal configured to receive the detecting signal.

9. The apparatus of claim 7,
   wherein the second switching section includes a pass gate having an input terminal configured to receive the second column selecting signal output from the signal control unit, and a first control terminal and a second control terminal configured to receive the detecting signal.

* * * * *